(12) United States Patent
Matsuo

(10) Patent No.: US 6,873,519 B2
(45) Date of Patent: Mar. 29, 2005

(54) ELECTRONIC COMPONENT ASSEMBLY, AND INTERMEDIATE CONNECTOR AND UNIT BODY FOR THE SAME

(75) Inventor: Tsutomu Matsuo, Tokyo (JP)

(73) Assignee: Hirose Electric Co., Ltd., Tokyo (JP)

( * ) Notice: Subject to any disclaimer, the term of this patent is extended or adjusted under 35 U.S.C. 154(b) by 0 days.

(21) Appl. No.: 10/300,855

(22) Filed: Nov. 21, 2002

(65) Prior Publication Data

US 2003/0095391 A1 May 22, 2003

(30) Foreign Application Priority Data

Nov. 22, 2001 (JP) ....................................... 2001-357903

(51) Int. Cl.⁷ ................................................ G06F 1/16
(52) U.S. Cl. ....................................... 361/679; 361/736
(58) Field of Search ................................ 361/679, 736, 361/760–761, 772–774, 791, 795, 801–803, 807, 810, 764, 767

(56) References Cited

U.S. PATENT DOCUMENTS 3,764,856 A * 10/1973 Martin ....................... 361/709
5,309,324 A    5/1994 Herandez et al.
5,570,274 A   10/1996 Saito et al.
5,959,840 A *  9/1999 Collins et al. .............. 361/713
2001/0020545 A1 * 9/2001 Eldridge et al.

FOREIGN PATENT DOCUMENTS

| DE | 4326104 | 2/1995 |
| GB | 2193038 | 1/1988 |
| GB | 2202375 | 9/1988 |
| JP | 8-31532 | 2/1996 |

* cited by examiner

Primary Examiner—Yean-Hsi Chang
(74) Attorney, Agent, or Firm—Takeuchi & Takeuchi

(57) ABSTRACT

An electronic component assembly mounted on a circuit board (1) comprises an intermediate connector (2) mounted on the circuit board and having a first space (7) for accommodating first electronic components (8A, 8B, and 8C) provided on the circuit board and a unit body (11) provided on the intermediate connector and connected to the circuit board through the intermediate connector. The unit body comprises a connector member (12) having a second space (16) and a mounting member (13) having second electronic component (19A, 19B, and 19C) accommodated in the second space.

7 Claims, 3 Drawing Sheets

ELECTRONIC COMPONENT ASSEMBLY, AND INTERMEDIATE CONNECTOR AND UNIT BODY FOR THE SAME

BACKGROUND OF THE INVENTION

1. Field of the Invention

The present invention relates to an electronic component assembly formed of an intermediate connector and a unit body, wherein the unit body including electronic components is connected to a circuit board through the intermediate connector.

2. Description of the Related Art

An electronic component assembly of this type is disclosed in Japanese Patent Application Kokai No. 08-31532. As shown in FIG. 3, this conventional electronic component is assembly comprises, an intermediate connector 52 provided on a circuit board 51 and a unit body 53 connected to the intermediate connector 52.

The intermediate connector 52 comprises a plate-shaped housing 54 provided in parallel to the circuit board 51 and a plurality of terminals 55 arranged through the housing 54 in two dimensional directions. Each terminal 55 comprises a lower projecting portion 55A connected to a corresponding circuit of the circuit board 51 by soldering and an upper female receiving portion 55B projecting from the upper surface of the housing 54.

The unit body 53 comprises a connector member 56 and an electronic component 57, such as an IC, mounted on the connector member 56. The connector member 56 comprises a plate-shaped housing 56A provided in parallel to the intermediate connector 51 and having a size equal to that of intermediate connector 51, and pin-like terminals 58 provided through the housing 56A. The lower part of each terminal 58 projects from the lower face of the housing 56A and the upper part thereof is connected to the electronic component 57 by a soldering ball 59. The electronic component 57 and the connector member 56 are supported by a fixing jig 60 to make the unit body 53.

Recently, there is a demand for a small electronic component assembly, especially a thin electronic component assembly. It is desirable that the electronic component assembly contains many components and contacts with minimized height.

In FIG. 3, however, the connector member 56 of the unit body 53 has only one electronic component 57 on the upper face thereof. Such an electronic component assembly does not meet the requirements for mounting a plurality of components and diversitfying the function. If other components are mounted in the vicinity of the electronic component 57, a space for wiring many connection terminals of the components is required, thus increasing the size of the assembly.

SUMMARY OF THE INVENTION

Accordingly, it is an object of the present invention to provide an electronic component assembly, and an intermediate connector and a unit body therefor, which permits the mounting of a plurality of electronic components without increasing the thickness thereof.

According to the present invention, an electronic component assembly comprises an intermediate connector mounted on and in parallel with a circuit board and a unit body connected to the circuit board through the intermediate connector.

The intermediate connector comprises a first space which is provided through a housing and accommodates electronic components mounted on the circuit board. The unit body comprises a connector member provided on the intermediate connector and having a space passing through the connector member at a position corresponding to the position of the first space, a plurality of male terminals provided on a face thereof facing to the intermediate connector, and a plurality of connection portions provided on the other face thereof and connected to the male terminals, and a mounting member provided on the connector member and having electronic components accommodated in the second space of the connector member and a plurality of connection pads at positions corresponding to the positions of the connection portions of the connector member.

According to the present invention, the first and second spaces make one space, when the assembly is built, to accommodate electronic components mounted on the circuit board and the unit body without increasing the thickness of the assembly. Since the connecting members to connect the intermediate connector and the unit body are provided in the periphery of the space, it is possible to increase the number of contacts included in the assembly without increasing the size of the assembly significantly.

Each of the first and second spaces is formed by providing either a rectangular opening or a cut-off portion open to the periphery of the intermediate connector of the intermediate connector and/or the connector member.

In the present invention, fixing of the intermediate connector to the circuit board and connecting of the mounting member to the connector member may be individually performed by different persons, and only final assembly for the electronic component assembly may be done a user. Also, mounting of electronic components on the mounting member and supplying of the connector member may be performed by different persons.

DESCRIPTION OF THE PREFERRED EMBODIMENTS

Embodiments of the invention will now be described according to the accompanying drawings.

Figure 1:
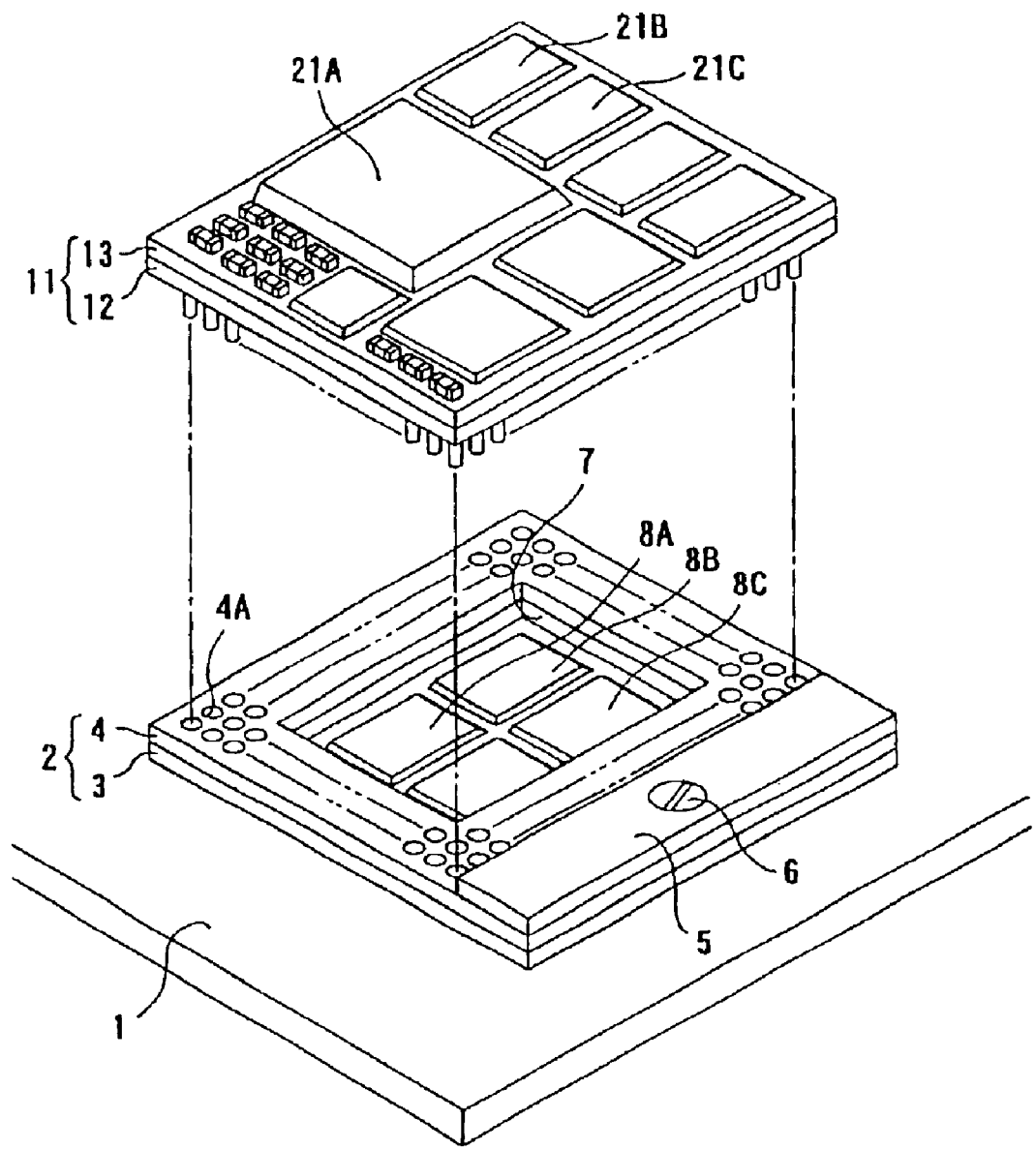
FIG. 1 is a perspective view of an electronic component assembly according to an embodiment of the invention, showing a unit body and an intermediate connector before connected to each other.

In FIG. 1, an intermediate connector 2 according to an embodiment of the invention is provided on a circuit board 1 and connected to a predetermined circuit (not shown) of the circuit board 1.

The intermediate connector 1 comprises a fixed member 3 fixed to the circuit board 1 and a movable member 4 slidable on the fixed member 3 by a predetermined distance. The fixed member 3 has a plurality of female terminals (not shown) which are connected to the predetermined circuit of the circuit board 1 and have receiving sections for receiving male terminals of a unit body as described below. The movable member 4 has insertion holes 4A at positions corresponding to positions of the female terminals so that the male terminals of the unit body are inserted through the insertion holes 4A into the receiving section of the fixed member 3. In this embodiment, the male terminals are inserted into or removed from the receiving section of the female terminals with no or low resistance. When the movable member 4 slides on the fixed member 3, the male and female terminals are press-contacted with a certain amount of contact pressure. A plate-like metal member 5 is provided on a side portion of the fixed member 4 outside the region that the insertion holes 4A are arranged. An eccentric cam 6 is provided through the metal, movable, and fixed members 5, 4, and 3. When the eccentric cam is turned in the clockwise or counterclockwise direction with a tool, such as a driver, the movable member 4 slides on the fixed member 3 in the direction for increasing or decreasing the contact pressure between the movable and fixed members 4 and 3. The intermediate connector of this type is conventional and well known.

The intermediate connector 2 according to the invention comprises a rectangular space 7 passing through the fixed and movable members 3 and 4. The fixed and movable members 3 and 4 have the female terminals and the insertion holes 4A, respectively, at the periphery of the rectangular space 7. Various kinds of electronic components 8A, 8B, and 8C are provided on the circuit board 1 within the region of the rectangular space 7 so that they are accommodated in the space 7 and connected to the circuit of the circuit board 1.

Figure 2:
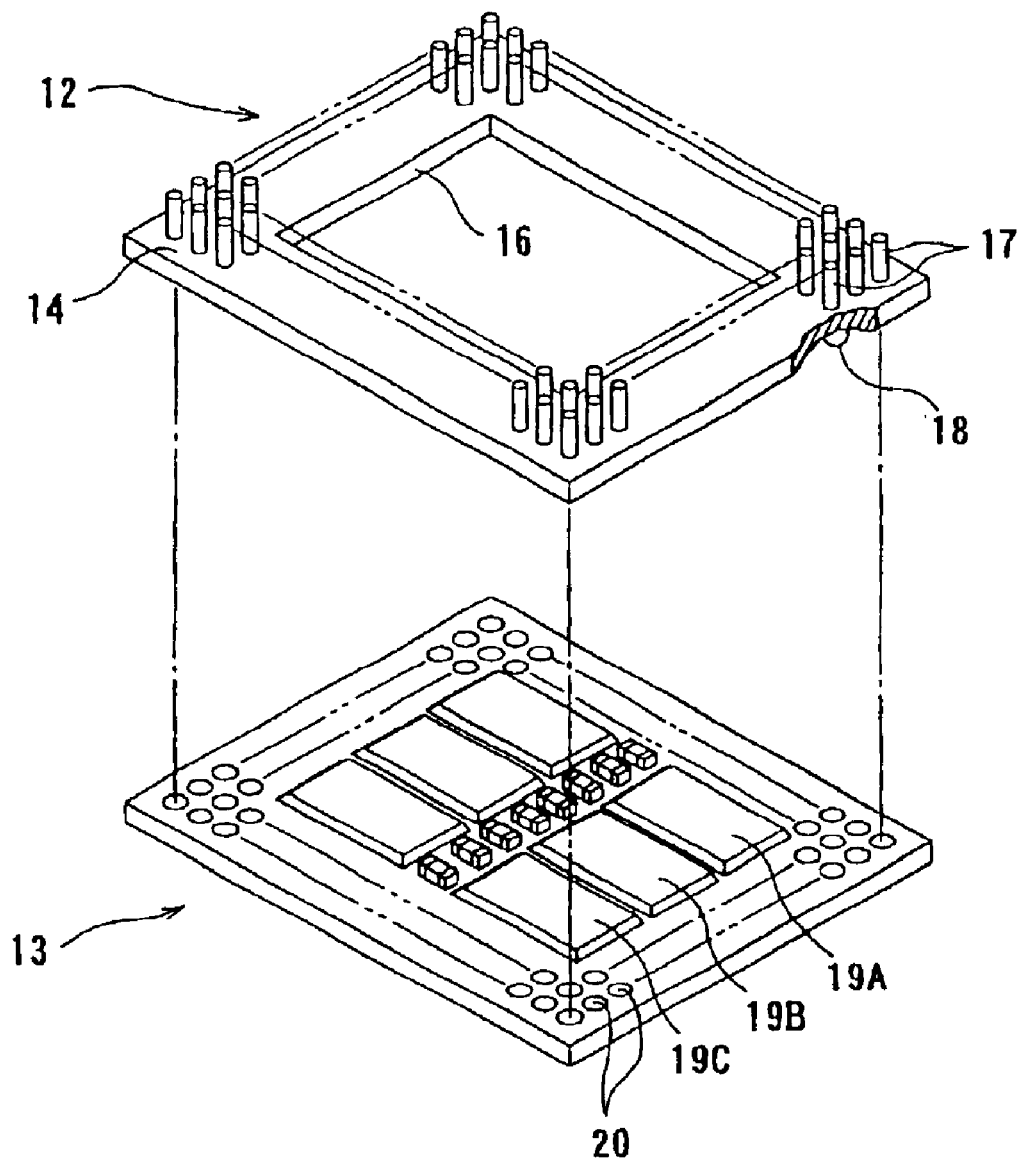
FIG. 2 is a perspective view of the unit body in FIG. 1 in reverse position, showing a connector member and a mounting member before assembled to the unit body.
Figure 3:
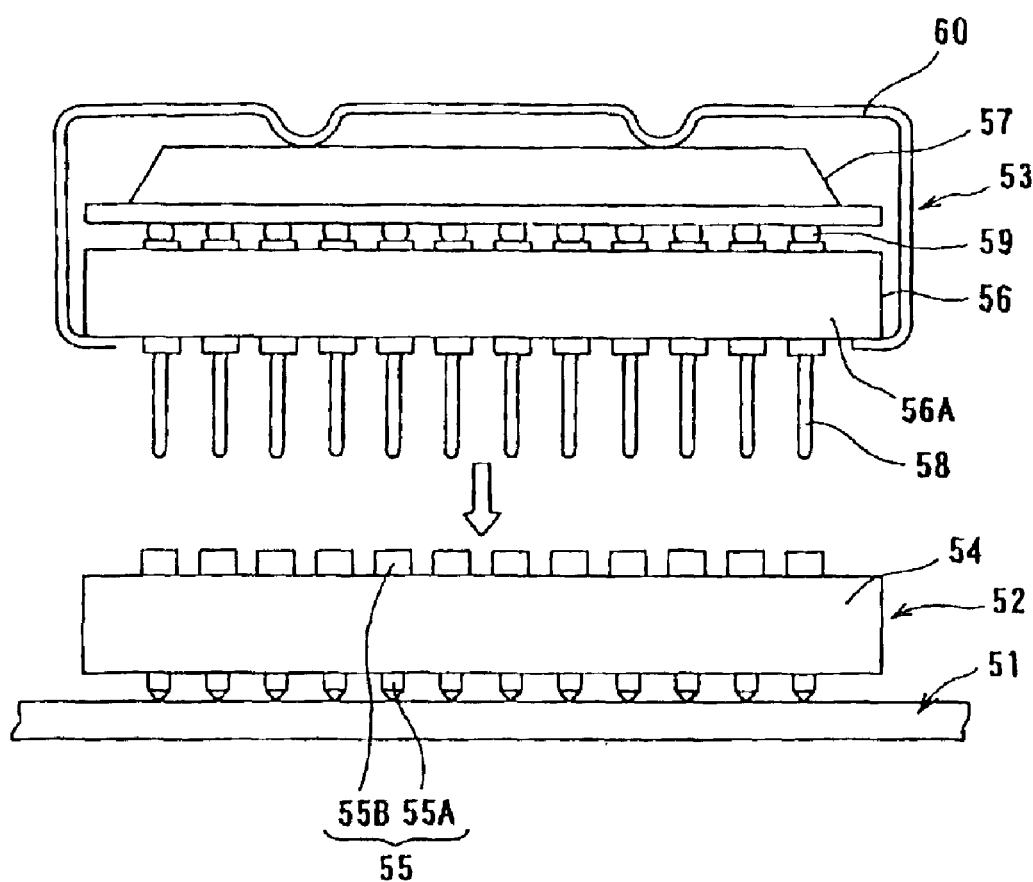
FIG. 3 is a front view of an electronic component assembly according to the prior art.

The unit body 11 comprises a plate-like connector member 12 and a plate-like mounting member 13, both of which are attached to each other. In FIG. 2, the connector and mounting members 12 and 13 are reversed and separated from each other. A plurality of pin-like female terminals 17 are provided in a square frame-shaped housing 14. The housing 14 has an external size and a rectangular opening 16 which correspond to the region of the intermediate connector 2 that the insertion holes 4A are arranged. The female terminals 17 are provided on a face of the housing 14 facing to the intermediate connector 2 (the upper face in FIG. 2) at positions corresponding to the positions of the insertion holes 4A. Each of the male terminals 17 is provided with a connection section 18, such as a soldering ball, on the other face of the housing (lower face in FIG. 2).

In FIG. 2, a plurality of electronic components 19A, 19B, and 19C, such as memories, are mounted on a face (upper face in FIG. 2) facing to the connector member 12 and connected to a predetermined circuit. The electronic components 19A, 19B, and 19C are provided in a region, which corresponds to the rectangular opening 16 of the connector member 12. A plurality of connection pads 20 are provided outside the region at positions corresponding to the positions of connection portions 18 of the connector member 12. The connection pads 20 are connected to a predetermined circuit. In this embodiment, a plurality of additional electronic components 21A, 21B, and 21C are mounted on the other face (lower face in FIG. 2 and upper face in FIG. 1) of the mounting member 13 and connected to a predetermined circuit.

The assembly of the unit body 11 and the connection of the unit body 11 to the intermediate connector 2 are performed as below.

(1) Firstly, the mounting and connector members 13 and 12 are integrally connected to make the unit body 11. For the connection, the connector member 12 is placed on the mounting member 13 such that the respective connection portions 18 of the connector portions 12 are aligned with the corresponding connection pads 20 of the mounting member 13. Then, hot air is applied to the connection portions 18 to melt the soldering balls of the connection portions 18. Thus, the mounting and connector members 13 and 12 are integrated to the unit body 11 and the electronic components 19A, 19B, and 19C provided on a face of the mounting member 13 are accommodated in the space of the opening 16 of the connector member 12.

(2) As shown in FIG. 1, the male terminals 17 are inserted into the corresponding insertion holes 4A of the movable member 4 to enter the receiving section of the corresponding female terminals of the fixed member 3 with no or low resistance.

(3) Then, the eccentric cam 6 is turned by a predetermined angle to make the movable member 4 slide on the fixed member 3. The male terminals 17 move within the receiving section of the female terminals and are brought into press-contact with the contact section of the female terminals. Thus, the electronic components of the unit body 11 are electrically connected to the circuit of the circuit board 1 through the male and female terminals to provide a designated electronic components assembly.

The invention is not limited to the above-illustrated embodiment. The male terminals 17 may be press-fitted into the female terminals instead of no-resistance or low-resistance insertion. In this embodiment, the space 7 provided in the intermediate connector 2 accommodates the electronic components 8A, 8b, and 8C mounted on the circuit board 1 and the space 16 provided in the unit body 11 accommodates the electronic components 19A, 19B, and 19C mounted on the mounting member 13. However, since the spaces 7 and 16 communicate to each other to make a large space when the electronic component assembly is built, the electronic components 8A, 8B, 8C, 19A, 19B, and 19C may be commonly accommodated in the large space. It is not always necessary to provide the electronic components 21A, 21B, and 21C, so that if they are not provided, a thinner electronic component assembly is realized.

The spaces 7 and 16 may be formed by providing at least one cut-of portion on sides of the intermediate connector 2 and/or the connector member 12 instead of providing a rectangular opening.

According to the present invention, a plurality of electronic components are accommodated in the spaces of the intermediate connector and the connector member of the unit body and the connections between each assembly member are made outside the spaces, the electronic components are accommodated within the thickness of the assembly members. Consequently, the increased number of contact points is secured with a little increase of width and length of the assembly but no increase of the thickness. Also, since additional electronic components are mounted on the other face (upper face in FIG. 1) of the mounting member, if necessary, the freedom of design and the mounting density of components are increased and the diversified function is realized.

What is claimed is:

1. An electronic component assembly mounted on a circuit board, comprising:

an intermediate connector mounted on and in parallel with said circuit board and having a housing and a first space passing through said housing for accommodating at least one first electronic component provided on said circuit board; and a one piece unit body provided on and in parallel with said intermediate connector and said circuit board through said intermediate connector, said one piece unit body comprising:

a connector member provided on said intermediate connector and having a second space passing through said connector member at a position corresponding to a position of said first space, a plurality of male terminals provided on a face thereof facing to said intermediate connector, and a plurality of connection portions provided on the other face thereof and connected to said male terminals; and a mounting member provided on said connector member and having at least one second electronic component accommodated in said second space of said connector member and a plurality of connection pads provided at positions corresponding to positions of said connected to said connection portions, wherein said connector and mounting members are Plate-shaped and adhere to each other to make said one piece unit body, said mounting member having no pin cavities for receiving said male terminals of said connector member so that no one piece unit body can be connected to another one piece unit body one upon another.

2. An intermediate connector for connecting a unit body and mounted on and in parallel with a circuit board, said intermediate connector being mounted on and in parallel with said circuit board and said unit body being provided on and in parallel with said intermediate connector, said intermediate connector comprising:

a housing;

a space passing through said housing for accommodating at least one electronic component provided on said circuit board; and a plurality of insertion holes passing through said housing, wherein male terminals of said unit body are inserted into said insertion holes to be connected to said circuit board, wherein said intermediate connector is composed of a fixed member fixed to said circuit board and a movable member slidable on said fixed member.

3. The intermediate connector according to claim 2, wherein said space is formed by providing a rectangular opening.

4. The intermediate connector according to claim 2, wherein said space is formed by providing at least one cut-off portion.

5. A one piece unit body provided on and in parallel with an intermediate connector and connected to a circuit board through said intermediate connector, said one piece unit body comprising:

a connector member provided on said intermediate connector and having a space passing through said connector member, a plurality of male terminals provided on a face thereof facing to said intermediate connector, and a plurality of connection portions provided on the other face thereof and connected to said male terminals; and a mounting member provided on said connector member and having a space in which at least one electronic component is provided and a plurality of connection pads at positions corresponding to positions of said connection portions of said connector member and connected to said connection portions, wherein said connector and mounting members are plate-shaped and adhere to each other to make said one piece unit body, said mounting member having no pin cavities for receiving said male terminals of said connector member so that no one piece unit body can be connected to another one piece unit body one upon another.

6. The unit body according to claim 5, wherein said space is formed by providing a rectangular opening.

7. The unit body according to claim 5, wherein said space is formed by providing at least one cut-off portion.

* * * * *